United States Patent [19]

Chamberlain et al.

[11] Patent Number: 4,513,431
[45] Date of Patent: Apr. 23, 1985

[54] CHARGE COUPLED DEVICE OUTPUT CIRCUIT STRUCTURE

[75] Inventors: Savvas G. Chamberlain, Waterloo, Canada; Eugene S. Schlig, Somers, N.Y.

[73] Assignee: International Business Machines Corporation, Armonk, N.Y.

[21] Appl. No.: 385,587

[22] Filed: Jun. 7, 1982

[51] Int. Cl.³ ................... G11C 19/28; H01L 29/78
[52] U.S. Cl. ..................................... 377/60; 357/24
[58] Field of Search ..................... 357/24; 377/57–63

[56] References Cited

U.S. PATENT DOCUMENTS

| | | | |
|---|---|---|---|
| 4,118,795 | 10/1978 | Frye et al. | 365/222 |
| 4,132,903 | 1/1979 | Graham | 307/221 D |
| 4,139,784 | 2/1979 | Sauer | 357/24 M |
| 4,242,600 | 12/1980 | Hoffman et al. | 307/221 D |

*Primary Examiner*—Gene M. Munson
*Attorney, Agent, or Firm*—John J. Goodwin

[57] ABSTRACT

This CCD structure comprises a substrate floating diffusion region from which an output signal is taken and a drain diffusion spaced apart from the output diffusion and from which the charge is returned. An electrode to be pulsed is placed immediately preceding the floating diffusion and a plurality of electrodes is interposed between the two diffusions. The first such electrode beyond the output floating diffusion is operated as a reset pulse gate electrode and the last such electrode before the drain diffusion is operated as a drain pulse gate electrode, while the intermediate electrode(s) have phased clock pulses applied thereto in synchronism with such phased clock pulses applied to other electrodes of the overall CCD circuit arrangement. The preceding pulsed electrode serves to extend the lower limit of the potential change of the floating diffusion. The interposed electrodes permit signal charge to be transferred out of the floating diffusion into a gate-induced potential well instead of directly into the drain diffusion, extending the upper limit of potential change of the floating diffusion. Further, the drain gate isolates the drain diffusion from the preceding final CCD stages thereby obviating "charge sloshing".

6 Claims, 10 Drawing Figures

CHARGE COUPLED DEVICE OUTPUT CIRCUIT STRUCTURE

FIELD

The invention relates to Charge Coupled Device (CCD) structure and it particularly pertains to such structures for use in the output circuit portion thereof.

BACKGROUND

There now are a fairly large number of CCD structures and circuits for use therewith. The output stage of these arrangements has received a great deal of attention and still suffers from low output potential swing. The output from the CCD is sometimes connected to a voltage amplifier to increase the output potential swing, but that expedient introduces random noise into the output signal. Thus, an increase in output potential swing is desirable to obtain by altering the device structure rather than by means of amplifying circuitry.

SUMMARY

The objects of the invention indirectly referred to hereinbefore and those that will appear as the specification progresses are attained by novel CCD structure in the output stage that is relatively simple to fabricate in the manner of fabrication of the preceding stages of the CCD.

The structure comprises a CCD structure having a floating diffusion region from which an output signal proportional to signal charge is taken and a drain diffusion spaced apart from the output diffusion and to which the signal charge is returned as drain operating potential is applied. A plurality of electrodes are interposed in typical CCD device fashion between these two final diffusions of the overall CCD structure.

In some prior arrangements, a single direct potential biased barrier electrode is placed immediately preceding the first diffusion, and a single pulsed electrode is interposed between the two diffusions for operating as a reset gate electrode of a field effect transistor comprising the floating (source) diffusion, the gate electrode and the drain diffusion. This latter arrangement resets the floating diffusion for the next charge to be processed. In doing so, however, the potential change of the floating diffusion due to signal charge is severely limited, which limitation is obviated by the arrangement according to the invention.

According to the invention, a pulsed electrode is placed immediately preceding the floating diffusion and a plurality of electrodes is interposed between the two diffusions. A minimum of three interposed electrodes is recommended but four are suggested by practical design considerations and more are indicated for some designs. The first such electrode beyond the output floating diffusion is operated as a reset pulse gate electrode and the last such electrode before the drain diffusion is operated as a drain pulse gate electrode, while the intermediate electrode, or electrodes, have phased clock pulses applied thereto in synchronism with such phased clock pulses applied to other electrodes of the overall CCD circuit arrangement.

The preceding pulsed electrode serves to extend the lower limit of the potential change of the floating diffusion. The interposed electrodes permit signal charge to be transferred out of the floating diffusion into a gate-induced potential well instead of directly into the drain diffusion, extending the upper limit of potential change of the floating diffusion. Further, the drain gate isolates the drain diffusion from the preceding final CCD stages thereby obviating "charge sloshing".

PRIOR ART REFERENCES

Pertinent U.S. patents having structural features in common with that of the invention are listed below.

| | | | |
|---|---|---|---|
| 3,971,003 | 7/1976 | Kosonocky | 340/173R |
| 4,016,550 | 4/1977 | Weimer | 340/173R |
| 4,055,836 | 10/1977 | Weimer | 340/173R |
| 4,118,795 | 10/1978 | Frye, et al | 365/222 |
| 4,132,903 | 1/1979 | Graham | 307/221D |
| 4,242,600 | 12/1980 | Hoffman, et al | 307/221D |
| 4,264,930 | 4/1981 | White | 358/213 |

The patents to Kosonocky, to Weimer, and to White disclose CCD and like devices of the imaging variety which furnish the background of the CCD art leading to that of the invention.

Frye, et al, disclose a pair of cross-couple CCD arrangements of the prior art that overcome some prior art problems.

The patent to Graham is directed to the output stage of a CCD arrangement which has an electrode doped at its outer edges in dissimilar polarity.

Hoffman and Mauthe show a CCD structure and a circuit arrangement which provide improved output potentials by a regenerative or positive feedback arrangement.

None of these references, alone or in combination, show or suggest the CCD structure and/or the circuit arrangement according to the invention by which phased clock gating isolates the floating diffusion from the drain diffusion and prevents loss of output potential from the overall CCD and circuit arrangement.

DRAWING

In order that the full advantage of the invention obtain in practice, the best mode embodiment thereof, given by way of example only, is described in detail hereinafter with reference to the accompanying drawing forming a part of the specification and in which.

Figure 4A:
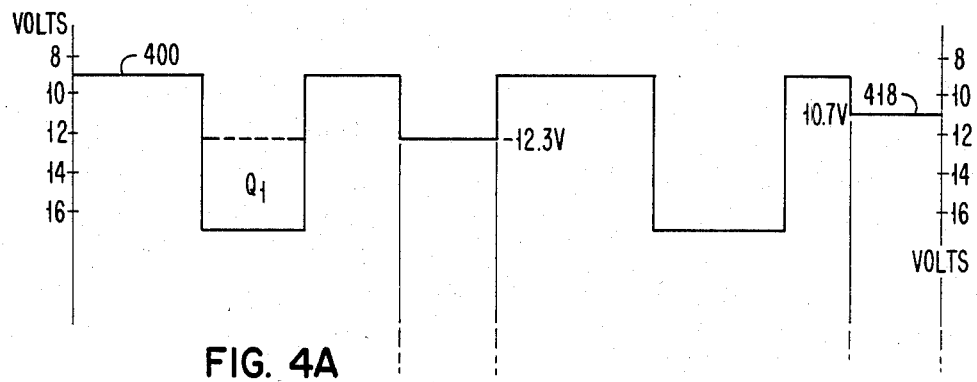
Figure 4B:
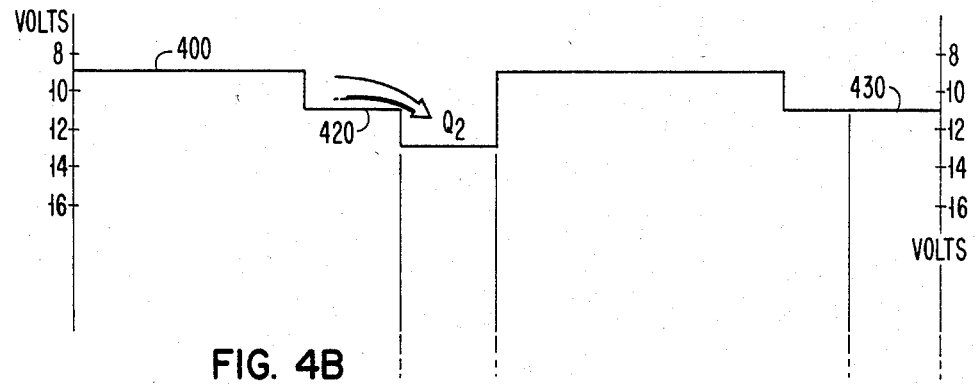
Figure 4C:
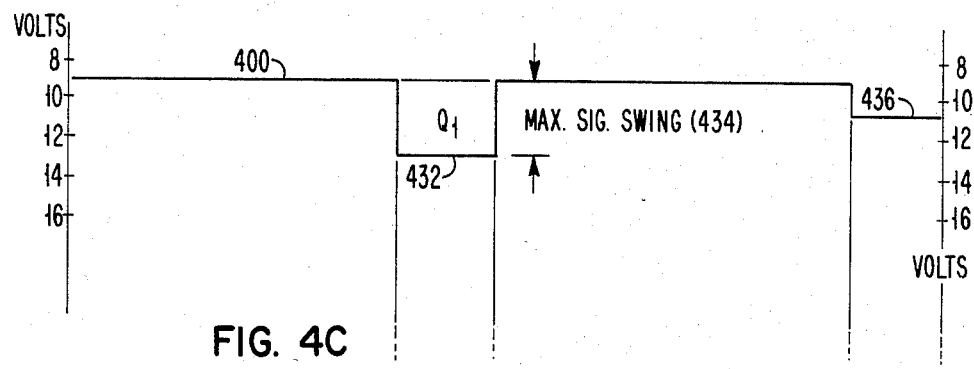
Figure 4D:
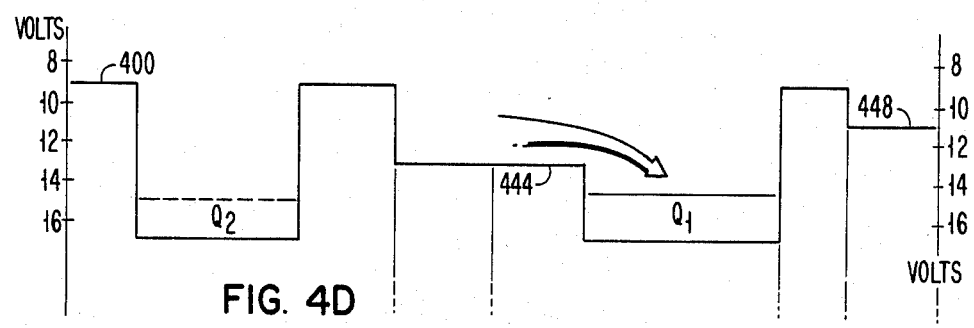
Figure 4E:
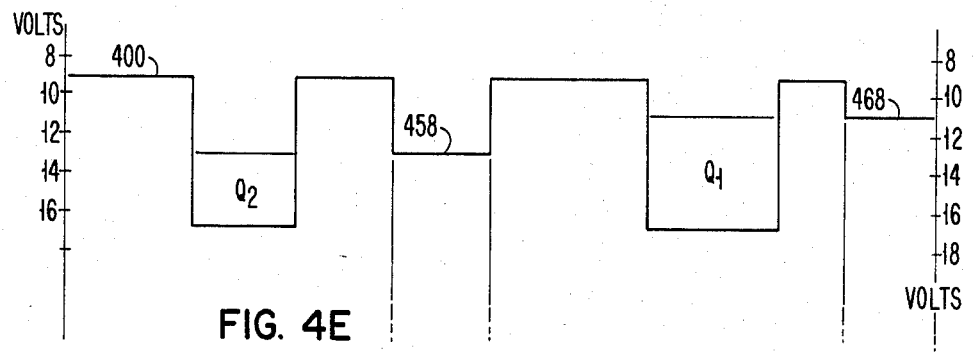
Figure 4F:
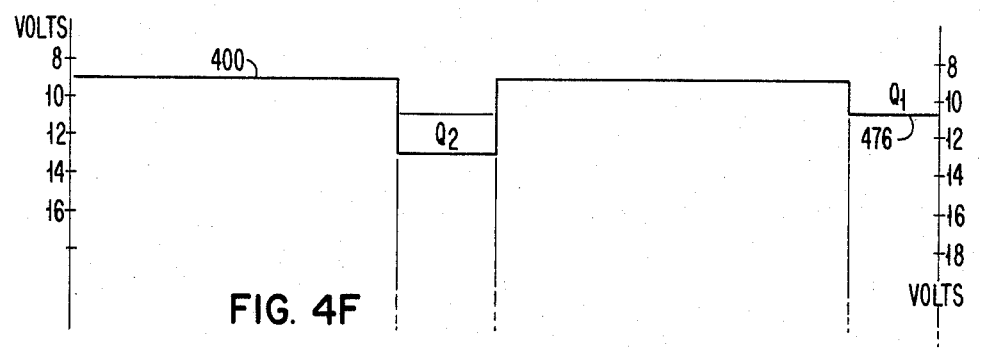
Figure 5:
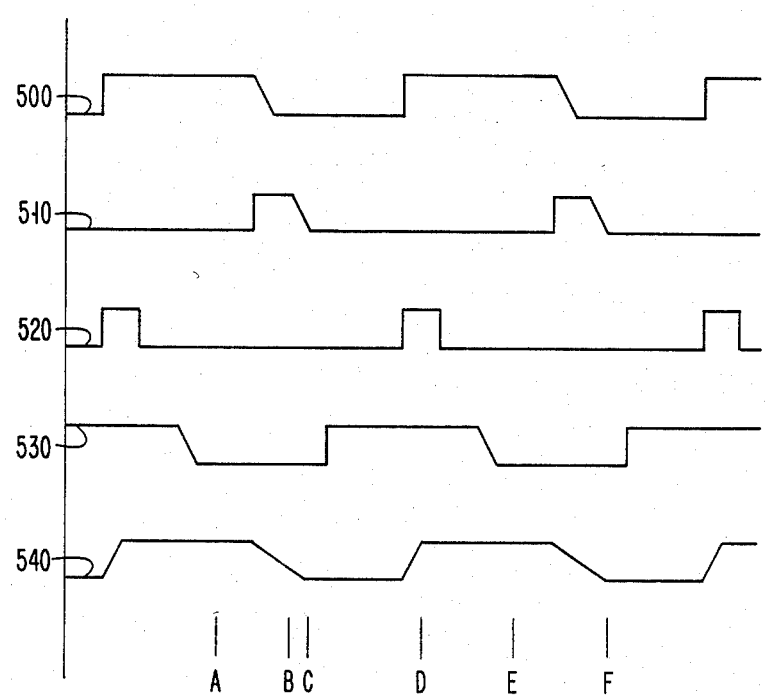

FIG. 4 (sections A through F being taken together) is a graphical representation of the electrostatic channel potentials also spatially correlated to the structure to be useful in an understanding of the CCD according to the invention; and FIG. 5 is a graphical representation of waveforms appearing in the operation of output circuitry incorporating the CCD according to the invention.

DESCRIPTION

Prior Art Structure

Figure 1:
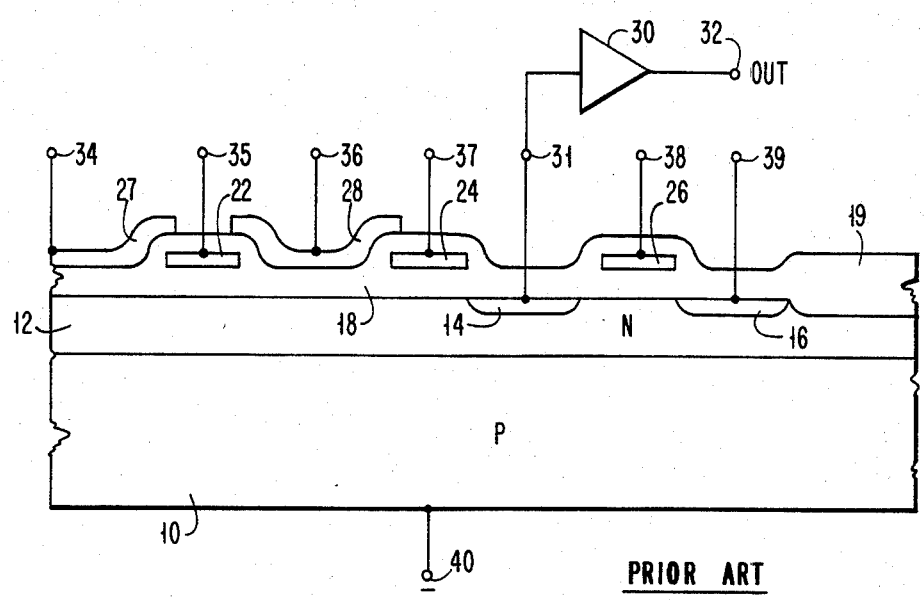
FIG. 1 is a schematic diagram of a portion of a prior art CCD structure.

Explanatory of the background of the invention, reference is made to FIG. 1 which depicts a schematic cross-section of the output stage portion of prior art "floating diffusion" CCD structure. An N-channel, buried channel device is shown having a P-type silicon substrate 10 on which an N-type ion implant layer 12 is formed. Layer 12 may alternatively be formed as a profiled N-type layer fabricated by means of two or more ion implantation steps. An N+-type floating diffusion 14 and an N+-type drain diffusion 16 are diffused into the layer 12 over which a layer 18 of silicon dioxide insulation is formed as a base for a number of electrodes 22,25,26,27 and 28 of polysilicon material which are arranged in conventional manner as shown. Output source follower and/or amplifying circuitry 30 is connected between terminals 31 and 32. CCD clock pulse train phases 02,03 and 04 are applied to terminals 34,35 and 36. Direct barrier potential on the order of 1 volt is applied to terminal 37 leading to the barrier electrode 24. Reset pulses are applied to terminal 38 leading to the reset gate electrode 26. A drain potential of the order of 8.5 v. is applied to terminal 39 leading to the diffused drain electrode 16 and substrate potential of the order of $-2.2$ v. is applied to the respective terminal 40.

The structure of FIG. 1, of course, in actuality extends perpendicular to the drawing. The CCD channel is delimited on its periphery by a channel-stop structure 19 as known in the art.

Figure 2:
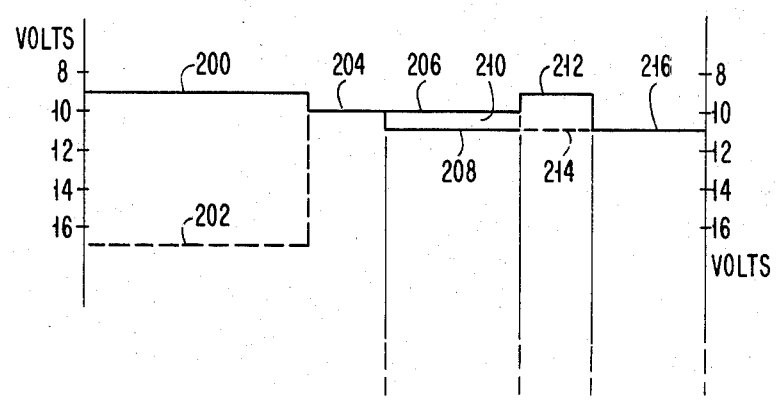
FIG. 2 is a graphical representation of the electrostatic channel potential spatially correlated to the structure to be useful in an understanding of the prior art arrangement shown in FIG. 1.

The method of operation of the prior art output structure illustrated in FIG. 1 in the form of a schematic cross-section of a portion of the chip is correlated thereto by FIG. 2 showing a plot of electrostatic channel potential relative to the substrate against the spacing along the structure. For purposes of this illustration, the potentials given are those obtained in actual practice, but these are exemplary values. As the clock signals on the electrode terminals 35,36 (and other terminals not shown) of the CCD register cycle between zero and 8.5 v. according to any of the known clocking schemes, signal charge packets (electrons) are transferred over the potential barrier beneath dc-biased barrier electrode 24 into the floating diffusion 14. The change in potential of the floating diffusion, caused by the signal charge, is applied to the input terminal of the output amplifier 30, usually a source follower circuit followed by at least one amplifier circuit, and this amplified signal at the terminal 32 is the output signal of the CCD chip. The source follower circuit is not a voltage amplifier, and voltage amplification at the stage following the source follower has the disadvantage of adding significant random noise to the signal.

After each charge packet has resided in the floating diffusion 14, that diffusion must be reset in preparation for the next packet by transferring the signal charge from the floating diffusion 14 to a drain diffusion 16 from which it is returned to an external power source. This is accomplished by applying a positive reset pulse to the reset gate electrode 26, momentarily turning on the MOS transistor comprising the floating diffusion 14, the reset gate 26, and the drain diffusion 16. Since electrons flow from regions of lower potential to regions of higher potential, the voltage change at the floating diffusion 14 due to signal charge is limited to the difference between the drain potential and the barrier potential. In one example of this design, that potential difference is only 0.8 v. This potential difference is further reduced by the need for a finite potential difference between the potential under the reset gate electrode 26 and the drain potential to speed up the charge transfer.

FIG. 2 is a graphical representation of the channel potential levels as distributed along the CCD (in FIG. 1) for a given charge coupled transfer operation. The level 200 represents the "OFF" level of a CCD stage, while the level 202 represents the "ON" level. The barrier level under the electrode 24 is represented at level 204. The levels 206 and 208 indicate the limits of the maximum signal potential range or swing 210 at the floating diffusion 14. The reset "OFF" level is that of 212 while the "ON" level is indicated by the level 214. The drain potential is indicated by the final level 216.

In this prior art scheme, the upper limit of the potential swing at the floating diffusion electrode 14 is less than 10.7 v., while the limit imposed by the allowable maximum input voltage of the output amplifier 30 would be about 12.3 v.

PREFERRED EMBODIMENT

Figure 3:
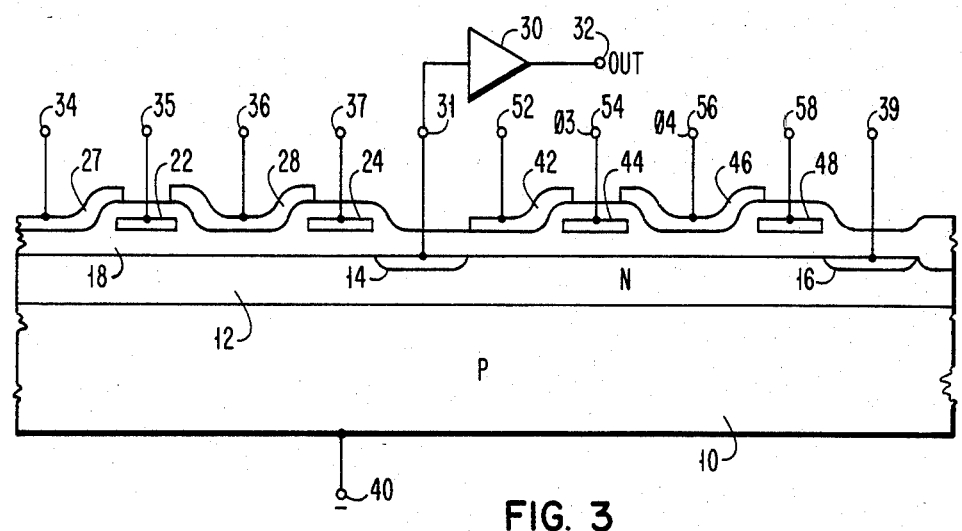
FIG. 3 is a schematic diagram of an output stage portion of a CCD according to the invention.

FIG. 3 depicts a schematic cross-section of a portion of a CCD structure according to the invention shown as applied to a structure as shown in FIG. 1 for clarity in discussion, but it is the be understood that the structure in accordance with the invention is applicable to many differing CCD as well.

As shown in FIG. 3, a number of electrodes 42,44,46 and 48 are arranged in much the same manner as before. Phase 2, 3 and 4 pulses are applied to terminals 34,35 and 36 as before and phase 3 and 4 pulses are now applied at terminals 54 and 56, respectively, leading to the electrodes 44 and 46. A set pulse rather than direct potential is applied to the terminal 37 leading to the barrier gate electrode 24 and now also to terminal 58 leading to a new drain gate electrode 48. Since the barrier gate 24 is a pulsed electrode, as shown in FIG. 3, it is termed a "set gate" hereinafter. Reset pulse is applied to the terminal 52 leading to the electrode 42 as was the case before with gate electrode 26 served by terminal 38. Drain and substrate potentials remain the same.

It is known in the art to interpose so-called "quiet gate" electrodes between the floating diffusion and adjacent pulsed gate electrodes (set and reset). Quiet gates are usually connected to the same voltage as the drain diffusion and serve to alternate undesirable capacitive coupling between the pulse sources and the floating diffusion. The CCD channels beneath the quiet gates have the same potential as the floating diffusion and behave like extensions of the floating diffusion. While quiet gates are not shown in FIG. 3, their use is within the spirit of the invention.

According to the invention, a structure as shown in FIG. 3 permits the floating diffusion potential swing to be increased to the difference between the latter limit of the 12.3 v. and the channel potential under the CCD gates that are "OFF", that is a potential of 8.9 v. That increased potential swing is 3.4 v. or more than four times greater than before.

FIGS. 4A–4F show the cross-section and potential diagrams according to the invention. The set gate electrode 24 receives a low amplitude pulse instead of dc, two additional CCD electrodes 44,46 are added after the reset gate electrode 42 and connected to the same clock phases as the two gates 22,28 preceding the barrier gate 24 and a drain gate 48 is added preceding the drain diffusion 16. The drain gate 48 may receive a small dc bias or, for convenience, be connected as shown to the same pulse as the set gate electrode 24.

The use of two CCD electrodes 44,46 between the reset and drain gates 42,48 is suggested by practical design considerations but for purposes of the invention the second electrode 46 may be eliminated. Similarly, more than two such electrodes, connected to properly sequenced phase pulses as known in the art, may be used.

In FIG. 4A, the first signal charge packet Q1 resides under the last gate electrode 28 of the CCD device at ∅4 time. Of course, the numbering of clock phases is arbitrary. The floating diffusion 14 stores only background charge and is at 12.3 v., the zero-signal level. In FIG. 4B ∅4 clock has turned off after the set gate electrode 24 received a positive pulse to raise its channel potential. The signal Q1 transfers over the potential barrier beneath set gate electrode 24 and resides in the floating diffusion 14 and under the set gate electrode 24 which then turns off transferring the charge Q1 into the floating diffusion 14. For the maximum allowable Q1, the floating diffusion potential is reduced by Q1 to 8.9 v., giving a floating diffusion potential swing of 3.4 v. as shown in FIG. 4C.

To reset the floating diffusion 14, a pulse is applied to the reset gate electrode 42 at a time in the clock cycle when both clocks ∅3 and ∅4 are high. The reset gate channel potential increases to 12.3 v., allowing the signal charge Q1 to transfer into the potential well under the electrodes 44, 46 as shown in FIG. 4D. The "ON" potential under the CCD gates in an example of this design is typically 16.6 v. when no charge is present. After the charge Q1 is removed, the floating diffusion 14 returns to 12.3 v. The reset gate 42 turns off and then the ∅3 electrode 44 turns off; leaving the charge Q1 under the ∅4 electrode 46 as in FIG. 4E. This is the same phase of the cycle as shown in FIG. 4A, and the next signal charge packet, Q2, now resides under the last CCD ∅4 electrode 28.

Finally, the set and drain gate electrodes 24,48 turn on and the ∅4 gate electrodes 28,46 turn off and the set and drain gate electrodes 24,48 turn off, transferring the charge Q1 into the drain diffusion 16 and Q2 into the floating diffusion 14 as shown in FIG. 4F FIG. 5 is a timing diagram showing only the essential waves helpful in an understanding of the operation of the arrangement according to the invention. The relative amplitudes of the waves are not indicated in FIG. 5. A curve 500 represents phase ∅4 of a four-phase clock wave applied to the electrodes 28 and 46. The pulse wave applied to the set gate electrode 24 and the drain gate electrode 48 is represented by a curve 510. The next curve 520 represents the pulse wave applied to the reset gate electrode 42, while curve 530 represents the phase ∅3 of the four-phase clock wave applied to electrodes 22 and 44. The final curve 540 represents the output potential wave at the floating diffusion 14; the same wave appears at the output terminal 32. The letters A,B . . . F refer to the FIGS. 4A, 4B, . . . 4F, respectively, and indicated the time at which the respective figures are applicable.

Thus, according to the invention, any dc biased barrier electrode is replaced with a pulsed "set gate" electrode in order to decrease the minimum allowable floating diffusion potential to the potential under gates at the clock down level, 8.9 v. in an example of an arrangement according to the invention. Then, electrodes are provided for arranging transfer of the signal charge out of the floating diffusion into a gate-induced potential well instead of directly into a drain diffusion. Since the potential well is at higher potential than the drain (16.6 v. compared to 10.7 v. in the example mentioned), the floating diffusion can be reset to a higher potential than the drain potential. That higher potential (12.3 v. in the example mentioned) is typically limited by the output amplifier design considerations.

An additional feature is the drain gate which isolates the drain diffusion from the final CCD stages, avoiding "charge sloshing".

While the invention has been described in terms of a preferred embodiment, and variations thereof have been suggested, it is clearly to be understood that those skilled in the art will apply the teachings of the invention in still other embodiments without departing from the spirit and scope of the invention as defined in the appended claims concluding the specification.

The invention claimed is:

1. An output circuit arrangement for operating a charge coupled device structure,
   said structure comprising
   a semiconductor substrate of one conductivity type,
   a layer of semiconductor material of another type implanted on said substrate,
   one deposit of enhanced semiconductor material of said other type diffused into said layer to form a floating diffusion,
   another deposit of said enhanced semiconductor material diffused into said layer at a location spaced apart from the location of said one deposit to form a drain diffusion,
   an output signal terminal electrically connected to said floating diffusion,
   a return potential terminal electrically connected to said drain diffusion,
   a multiple of at least two electrodes formed above said layer and spaced apart in succession preceding said one deposit,
   a multiple of at least three electrodes formed above said layer and spaced apart in succession between said deposits with each electrode having an electric circuit terminal,
   a layer of insulating material between said electrodes and said layer of implanted material,
   an output potential translating circuit having an input terminal connected to said output terminal and having a circuit output terminal,
   a source of first clocking wave connected to the first appearing electrode of said at least two electrodes preceding said floating diffusion and to the intermediate electrode of said multiple of electrodes succeeding said floating electrode,
   circuitry for applying a second reset wave of pulse energy to the first of said multiple of at least three electrodes succeeding said floating diffusion, and
   circuitry for applying set pulse energy to the second of the last of said at least two electrodes preceding said floating diffusion, and to the last of said multiple of at least three electrodes succeeding said floating diffusion.

2. An output circuit structure for a charge coupled device as defined in claim 1, and wherein
   said multiple or electrodes between said deposits consists of three electrodes.

3. An output circuit structure for a charge coupled device as defined in claim 1, and wherein
   said multiple of electrodes between said deposits consists of four electrodes.

4. An output circuit structure for a charge coupled device as defined in claim 1, and wherein
   said one conductivity type is P-type.

5. An output circuit structure for a charge coupled device as defined in claim 4, and wherein
   said implant is N-type.

6. An output circuit arrangement for operating a charge coupled device structure as defined in claim 1, and wherein
   said output potential translating circuit includes a source follower circuit.

* * * * *